United States Patent
Forman et al.

(10) Patent No.: US 9,227,224 B2
(45) Date of Patent: Jan. 5, 2016

(54) METHOD OF FORMING MACRO-STRUCTURED HIGH SURFACE AREA TRANSPARENT CONDUCTIVE OXIDE ELECTRODES

(75) Inventors: Arnold J. Forman, Palo Alto, CA (US); Zhebo Chen, Redwood City, CA (US); Thomas F. Jaramillo, Menlo Park, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 13/619,053

(22) Filed: Sep. 14, 2012

(65) Prior Publication Data
US 2013/0251893 A1    Sep. 26, 2013

Related U.S. Application Data

(60) Provisional application No. 61/573,997, filed on Sep. 15, 2011.

(51) Int. Cl.
- *B05D 5/12* (2006.01)
- *H01L 31/18* (2006.01)
- *C23C 18/12* (2006.01)

(52) U.S. Cl.
CPC .............. *B05D 5/12* (2013.01); *H01L 31/1884* (2013.01); *C23C 18/1216* (2013.01); *C23C 18/1262* (2013.01); *Y02E 10/50* (2013.01)

(58) Field of Classification Search
CPC ........ B05D 1/12; B05D 5/12; C23C 18/1216; C23C 18/1262
USPC .............. 427/58, 74, 126.3, 180, 189, 383.5, 427/383.7
See application file for complete search history.

(56) References Cited

U.S. PATENT DOCUMENTS

| 7,594,982 | B1 * | 9/2009 | Roscheisen et al. ........... 204/284 |
| 2006/0222855 | A1 * | 10/2006 | Yasuda ....................... 428/411.1 |
| 2006/0222859 | A1 * | 10/2006 | Yasuda et al. ................. 428/413 |
| 2008/0305573 | A1 * | 12/2008 | Sterzel ............................ 438/84 |
| 2009/0223562 | A1 * | 9/2009 | Niira et al. .................... 136/256 |
| 2011/0163403 | A1 * | 7/2011 | Bhatia et al. .................. 257/432 |
| 2013/0240027 | A1 * | 9/2013 | Zakhidov et al. ............. 136/255 |

OTHER PUBLICATIONS

T.O. Mason et al., Improved Transparent Conducting Oxides for Photovoltaics, Oct. 1-13, 2003, National Renewable Energy Laboratory, Golden, CO, USA.

* cited by examiner

*Primary Examiner* — Brian K Talbot
(74) *Attorney, Agent, or Firm* — Lumen Patent Firm

(57) ABSTRACT

A method of forming a high surface area transparent conducting electrode is provided that includes depositing a transparent conducting thin film on a conductive substrate, where the transparent conducting thin film includes transparent conductive particles and a solution-based transparent conducting adhesive layer which serves to coat and bind together the transparent conducting particles, and heat treating the transparent conducting adhesion layer on the conductive substrate, where an increased surface area transparent conducting electrode is formed.

10 Claims, 12 Drawing Sheets

(a)

METHOD OF FORMING MACRO-STRUCTURED HIGH SURFACE AREA TRANSPARENT CONDUCTIVE OXIDE ELECTRODES

CROSS-REFERENCE TO RELATED APPLICATIONS

This application claims priority from U.S. Provisional Patent Application 61/573,997 filed Sep. 15, 2011, which is incorporated herein by reference.

STATEMENT OF GOVERNMENT SPONSORED SUPPORT

This invention was made with Government support under contract DE-AC36-08GO28308 awarded by Department of Energy. The Government has certain rights in this invention.

FIELD OF THE INVENTION

The present invention relates generally to conducting films. More particularly, the invention relates to a high surface area transparent conducting film used as an electrode.

BACKGROUND OF THE INVENTION

A major hurdle towards the implementation of nanomaterials in practical electronic and optoelectronic device architectures is the tradeoff between the need to minimize charge transport lengths (electronic and/or ionic) vs. the need to achieve high mass loadings of active material per geometric device area (to obtain high capacity or high optical density). Controlling the micro and nanoscale structure of a transparent conducting oxide (TCO) electrode could yield an excellent platform for modern and future optoelectronic devices by combining large interfacial areas and high loading of active material with short charge transport distances and desirable light management characteristics. These are key features for boosting the performance of many devices including electrochemical sensors, catalysts, supercapacitors, batteries, photovoltaics (PV) and photoelectrodes. When used as a support for electrocatalyst and photoelectrode materials (e.g. for solar fuel synthesis), large-pore transparent conductive high surface area electrodes (HSEs) can be an enabling technology at both the fundamental and applied research levels. In electrocatalytic applications, large interfacial areas permit more efficient charge transfer by lowering local current densities which minimizes overpotential losses, while larger pores minimize mass transport losses that would otherwise arise from the extensive tortuosity that is characteristic of typical high surface area architectures. The latter is particularly important in applications where device efficiency is coupled to mass transport of liquid or gas phase species, thus necessitating the ability to tune and optimize HSE pore sizes to enable facile diffusion of reactants and products (such as gas bubbles) throughout the structure. Achieving an optimized structure enables higher turnover frequencies per geometric electrode area, resulting in more efficient product generation or more sensitive screening. In optoelectronic applications, the benefits of HSEs are two-fold: (1) increased loading of active materials such as thin film absorbers allows for increased device optical density while maintaining short minority carrier path lengths through the absorber and (2) texturing of the surface imparts more efficient light management than in a comparable planar device. Together, these benefits can potentially enable higher overall device efficiency.

HSEs, including those made of ITO, are characterized by three fundamental performance metrics which must be maximized simultaneously: (1) surface area, where the figure of merit is roughness factor (RF), (2) visible transparency and light management within the active layer, and (3) electrical conductivity. Additional desirable properties include mechanical strength (cohesion and adhesion), chemical and electrochemical stability, thermal stability and a facile synthesis amenable to large area fabrication. Historically, research directions for TCO films, including ITO, focused on creating dense, highly transparent planar films for commercial applications in consumer electronics, thermal glass coatings and other areas in which structured, light scattering films such as the HSE described here would be undesirable. The shifting of recent work towards structured films reflects a growing need for new materials systems related to high surface area TCO electrodes. Nevertheless, current literature covering structured TCO HSE materials is limited.

The structured ITO can be divided into two types of syntheses: (1) with or (2) without the use of templating/structure-directing agents. One of the most crystalline and highest electronic quality material reported among structured ITO films was prepared free of such agents but employed a costly high vacuum electron-beam synthesis step. Other examples of template-free structured ITO films include free-standing fibrous mats which may exhibit fairly high surface area but require further processing for incorporation into planar devices, as well as fiber networks. The majority of high surface area ITO syntheses require the addition (and inevitable removal) of templating/structure-directing agents, which can add significant cost and complexity that may limit the feasibility of large scale manufacturing. These include the use of (block co-)polymers, polymer spheres or binders, and densifying agents to produce structured ITO thin films and powders with periodic arrays of pores having either mesoscale (2-50 nm) or macroscale (>50 nm) diameters, as well as disordered ITO particle aggregations. The only report of an ITO electrode with a quantified surface area is an ordered mesoporous ITO thin film with ~10 nm pore diameters and a roughness factor of 45±3. This film has also demonstrated efficacy as an electrode, and thus represents the highest-performance high surface area ITO electrode to date.

What is needed is a method of fabricating transparent conducting HSE's with tunable roughness factors and adjustable pore sizes from the nanometer to micron scale using a low-cost and reduced complexity process that does not use templating.

SUMMARY OF THE INVENTION

To address the needs in the art, a method of forming a high surface area transparent conducting electrode is provided that includes depositing a transparent conducting thin film on a conductive substrate, where the transparent conducting thin film includes transparent conductive particles and a solution-based transparent conducting adhesive layer, where the solution-based transparent conducting adhesive layer coats and binds together the transparent conducting particles, and heat treating the transparent conducting adhesion layer on the conductive substrate, where an increased surface area transparent conducting electrode is formed.

In one aspect of the invention, the transparent conducting thin film has a thickness in a range of a mono-layer of the particles to $10^4$ layers of the particles.

According to another aspect of the invention, the transparent conducting particles have a size in a range of 1 nm to 1 mm.

In a further aspect of the invention, the transparent conducting electrode has a resistance in a range of 1-30 Ω sq$^{-1}$.

In one aspect of the invention, the transparent conducting electrode has roughness factor in a range of 1-140.

According to a further aspect of the invention, the transparent conducting electrode is calcined in i) air, ii) inert gas, or i) and ii).

In yet another aspect of the invention, the substrate can be non-transparent metal, carbon, conductive oxide or non-conductive material.

According to one aspect of the invention, the transparent conductive thin film can be indium tin oxide (ITO), fluorine doped tin oxide (FTO), Gallium zinc oxide, aluminum zinc oxide (AZO), antimony tin oxide (ATO), graphene, reduced graphene oxide, transparent metallic nanostructured networks.

In another aspect of the invention, the transparent conducting particles can include indium tin oxide (ITO), fluorine doped tin oxide (FTO), Gallium zinc oxide, aluminum zinc oxide (AZO), or antimony tin oxide (ATO).

In a further aspect of the invention, the transparent conducting adhesive layer is selected from the group consisting of indium tin oxide (ITO), fluorine doped tin oxide (FTO), Gallium zinc oxide, aluminum zinc oxide (AZO), and antimony tin oxide (ATO).

DETAILED DESCRIPTION

This invention is a high surface area transparent conducting oxide film that can be used as an electrode, or as a support that maximizes the interfacial area between the supported material and its surrounding medium (solid, liquid, or gas)—a critically important parameter to control in many electronic, sensing, and catalytic device applications among others. The ratio of the actual interfacial surface area of an electrode to the planar projected geometric area is defined as the Roughness Factor (RF). High surface area electrodes (HSEs) allow for more efficient charge transfer when compared to low-surface-area planar electrodes due to the availability of increased pathways for charge transport. HSEs of transparent conducting oxides (TCO) in particular, with porous/rough feature sizes on the Angstrom to micron scale find broad application in many technologically promising fields. Some examples include:

Photovoltaic (PV) devices having absorber materials with charge carrier transport lengths shorter than the minimum thickness required to fully absorb all incident light.

Photoelectrochemical (PEC) devices that experience the same mismatch in charge transport and light absorption length scales as described above for PV devices, but in addition would gain significant enhancement in electrochemical efficiency due to lower required electrocatalytic turnover frequencies, while enabling open pathways for the diffusion of reactants and products.

PV & PEC applications that can utilize the highly structured morphology to engender light trapping effects that increase the effective absorption path length of photons for more efficient absorption, i.e. an increase in the optical density of the device.

Conductive supports with a high surface area for the loading of electrochemical catalysts such that, for a given current density on a geometric area basis, the local current density (turnover frequency) at any active site is low, enabling more efficient operation of the catalyst near the reversible potential of a reaction of interest, while enabling open pathways (large pore diameters) for the diffusion of reactants and products.

Supports for higher loading of other catalysts (non-electrochemical) for increased activity and stability over time by providing a physical separation of fine catalyst particles/molecules, i.e. inhibited catalyst particle sintering.

Electrochemical sensors with higher sensitivity and/or faster response time due to increased signal collection area.

Batteries and capacitors with enhanced energy storage properties due to a large electrically accessible surface area.

Figure 1:
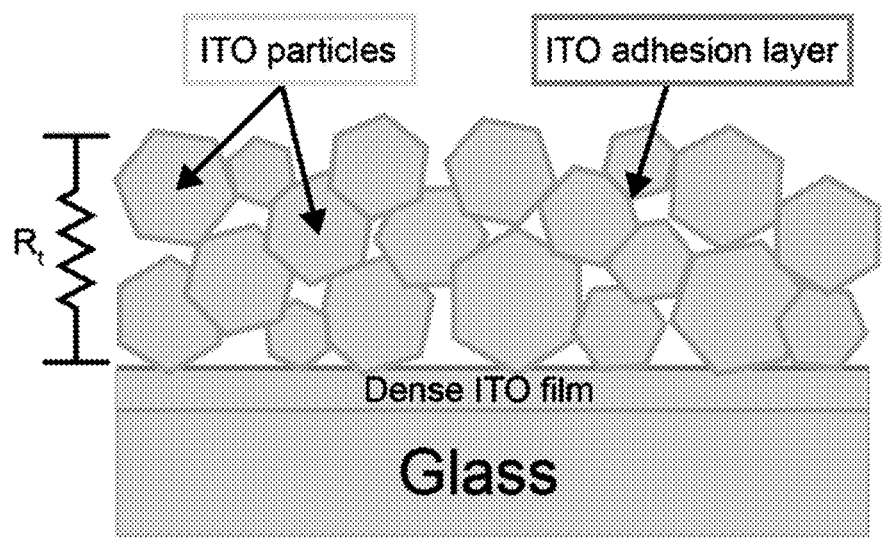
FIGS. 1a-1b show a cross section of ITO HSE and its three main components, and a top-down SEM image of ITO HSE, where the inset shows crystallinity of ITO adhesion layer, respectively, according to one embodiment of the current invention.
Figure 1:
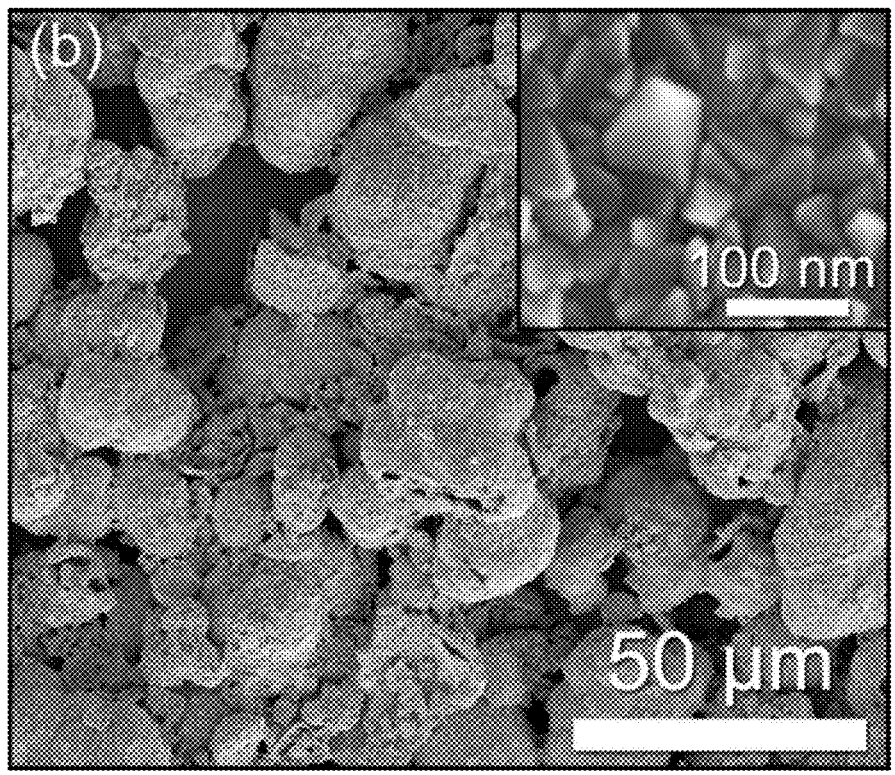
Figure 2:
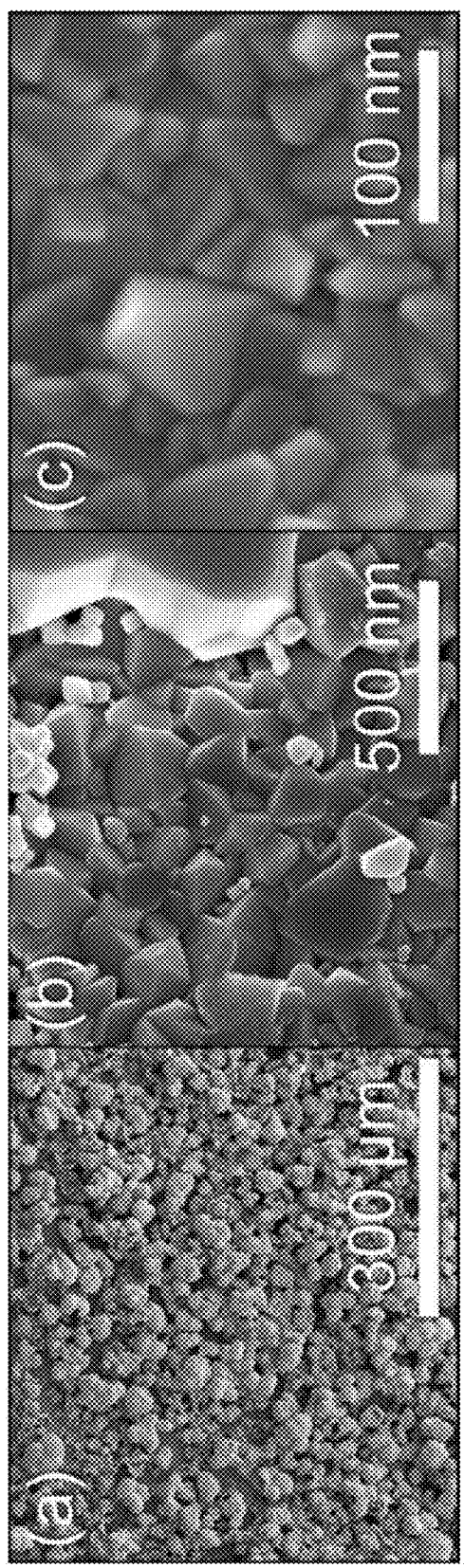
FIGS. 2a-2c show SEM images of a HSE film, where a) shows a wide area image showing morphology due to large ITO particles. b & c) show close up views of the surface of a large particle, and crystallites of the sol-gel layer which covers the large ITO particles are clearly visible, according to one embodiment of the invention.

According to one embodiment, the current invention includes a transparent conductive oxide high surface area electrode (TCO HSE) with hierarchical feature sizes and porosity ranging from Angstroms up through tens of microns (FIGS. 1a-1b). Electrodes include three main parts as shown in FIG. 1a:

1) A dense layer of conducting material, which serves to conduct charge laterally through the device structure. This layer can be either transparent or non-transparent depending on the application. If transparent, it may be of the same material as the overlying TCO HSE layer or of a different TCO material. If non-transparent, it may be optically reflective to increase photon path lengths through the TCO HSE layer.

2) Large particles of the TCO material of choice, preferably highly crystalline to help facilitate charge transport through the structure. Controlling the size of these particles will largely control feature sizes, pore sizes and light scattering characteristics of the resulting TCO HSE. The control over pore size afforded by these large particles tunes the larger length scale porosity of the final film. (See below for explanation of synthetic control over smaller length scale porosity.)

3) A binder material, which enhances the physical stability of the large particles creating a mechanically robust film and serves to further interconnect them electrically. The binder material can be a liquid phase mixture of a TCO precursor (e.g., sol-gel, metal salt solution, etc.) of the same composition as the large particles, but can be composed of other TCO precursors and/or materials as well.

In a further embodiment, the smaller length scale porosity of the binder material can be controlled by addition of a porogen and/or appropriate structure directing agent such as would be used to template a microporous or mesoporous material, respectively. This will control porosity on the smallest length scales in the final product film.

According to one embodiment of the invention the transparent conductive thin film is can include indium tin oxide (ITO), fluorine doped tin oxide (FTO), Gallium zinc oxide, aluminum zinc oxide (AZO), of antimony tin oxide (ATO). Additionally, the transparent conducting particles can include indium tin oxide (ITO), fluorine doped tin oxide (FTO), Gallium zinc oxide, aluminum zinc oxide (AZO), or antimony tin oxide (ATO).

In another embodiment, electrodes can be fabricated by any method suitable to deposit a controlled thickness of liquid and/or particulate slurry phase material to a surface such as dip-coating, screen printing, doctor-blading, spin-coating, spray coating, etc. According to one embodiment, general synthetic preparation includes:

a) a dense TCO film on a glass substrate (commercially available).
b) a fine powder of TCO particles (e.g., -325 mesh TCO powder).
c) a sol-gel mixture of TCO precursors.

The ITO HSE films are oxidatively stable in both 1.0 M NaOH (highly basic) and 0.5 M $H_2SO_4$ (highly acidic) media. The cathodic stability limit of the ITO is the reduction of tin and/or indium oxides at that particular pH.

This invention enables the fabrication of a wide array of high surface area materials supported onto transparent conducting oxide supports. Some advantages over existing state-of-the-art electrodes include:

Synthetically tunable roughness factor from ~1 to >140. The roughness factor is defined as the electrochemically active (ECA) surface area divided by the projected geometric area (GEO), i.e. $cm^2_{ECA}/cm^2_{GEO}$.

Fabrication via low cost, spatially scalable and homogeneous, non-high vacuum, highly reproducible, solution-phase routes.

Hierarchical feature sizes and pore diameters ranging from Angstroms up through tens of microns.

These features result in efficient light scattering within the electrode which is advantageous for PV and PEC applications due to efficient light trapping.

Macroscopically crack-free films for thicknesses greater than tens of microns. To our knowledge, this has never been achieved with current dense, micro or meso-structured film technologies.

High electrical conductivity/low sheet resistance.

Mechanical strength

Some variations of the invention can include:

The TCO material employed in this synthetic method can be any transparent, conducting material, for instance fluorine-doped tin oxide (FTO) or aluminum-doped zinc oxide (AZO), as well as other existing and future TCO compositions.

The dense, conductive base layer can be any conductor, (e.g. metallic, non-transparent, transparent, etc.)

If transparency is not required, high surface area electrodes can be prepared with this same approach using conductive, but not necessarily transparent, materials such as non-transparent oxides, carbon or metals.

The particle size can be varied to control pore size, roughness factor, and light scattering properties.

The binder layer can be of a micro or mesoporous material to further enhance and control the small scale porosity of the film.

The thickness of the deposited film can be varied to control the roughness factor.

The current invention has new features that include:

Materials having RF values measured in excess of 140. RFs in excess of 300 are expected to be achievable Efficient light scattering.

Thick films, which remain crack-free over a large area.

Spray deposition of film (amenable to rapid, large scale synthesis).

Non-template-assisted porous structuring (resulting in low-cost synthesis).

Facile inter and intra-pore diffusion compared to meso or microporous TCO films.

The current invention provides transparent conducting high surface area electrodes with tunable roughness factors and adjustable pore sizes from the nanometer to micron scale. According to one embodiment, the invention enables more rapid proliferation of nanomaterial devices by serving as a broadly functionalizable scaffold to support nanoscale active materials. Such scaffolds provide large interfacial surface areas as well as the ability to optimize both electronic and ionic charge transport throughout the device architecture. In a further embodiment, the invention includes fabrication of optically transparent high surface area electrodes made of indium tin oxide using a low cost and scalable synthetic approach without employing organic templating agents. This method is transferable to a broad number of transparent conducting oxide compositions and produces electrodes, which fulfill the requirements of a scaffold for nanomaterials. These electrodes are electrochemically stable and physically robust with tunable and electrochemically accessible roughness factors from 1 through ~140. A large-pore transparent conductive electrode with tunable high surface area is provided that also possesses excellent optical and conductive properties.

The current invention provides a reduced complexity and effective synthesis for producing a new type of porous HSE via a low cost, scalable, atmospheric pressure spray deposition of solution-phase precursors. Importantly, templating agents are not needed to introduce porosity, an advantageous feature for improved device performance and low cost manufacturing. The synthetic route according to one embodiment of the current invention produces HSEs, which simultaneously match superb physical characteristics with high performance electrical and optical characteristics. The invention produces mechanically durable films which can be >100 µm thick while remaining macroscopically crack-free, and that possess high surface area, with tunable RF values from 1 to 140. The films also exhibit low sheet resistance and a structure whose large surface area is accessible electrochemically. The films maintain excellent transparency in the visible region of the spectrum, and can diffusely scatter light for enhanced optical device response. This combination of properties has never before been demonstrated in transparent conducting oxide thin film electrodes.

In one embodiment, the method for synthesizing a TCO film with both high surface area and excellent conductivity includes combining two distinct types of ITO: a powder having large ITO particles and an ITO derived from sol-gel, as shown in FIG. 1a. The two types of ITO are combined in a hierarchical manner to form a composite film that takes advantage of the best properties of each component. The large, crystalline ITO particles within the composite film serve as the physical framework. The sol-gel derived ITO conformally coats the large particles, adhering them to one another and to the substrate in a mechanically robust fashion, allowing for conductivity throughout the entire film. The framework of large ITO particles is also responsible for producing macroscopic porosity within the film (see FIG. 1b) which, based purely on geometric considerations provides an increased RF of ~3 per additional monolayer, in the theoretical absence of surface texture or porosity.

The superb crystallinity within the large ITO particles allows for efficient transport of charge across long distances within each particle (microns). Careful selection of particle size tunes the final macro-porosity of the film, which, in turn, tunes its light scattering and intrapore mass transport characteristics. The conformal ITO sol-gel layer acts as an electrically conductive adhesive that further increases the surface area due to its own roughness and porosity. Since sol-gel processed thin films typically result in nanocrystalline compositions with low conductivity due to high granularity, it is essential that the large-crystallite, conductive ITO particles serve as a framework for charge transport through the resulting composite film. This open, porous composite structure is also able to efficiently relax internal stresses upon annealing, resulting in macroscopically crack-free films with thicknesses greater than tens of microns.

The ITO HSEs of the current invention include two layers shows in FIG. 1a: (1) the aforementioned two-component, high surface area ITO layer having large ITO particles coated with sol-gel derived ITO, and (2) a dense, conductive, planar ITO layer on glass upon which the high surface area ITO layer rests. Thus, the HSE is fabricated with three discrete ITO components: planar ITO, particulate ITO, and the adhesive sol-gel ITO. The underlying planar ITO substrate serves to move charge laterally through the device structure, though great flexibility exists when choosing the underlying conductive substrate as it need not be transparent, and reflective substrates may be preferred depending on the application. The substrate may include a wide range of metals or degenerately doped conductors that are stable under processing conditions In one embodiment, the high surface area ITO layer was deposited onto commercial planar ITO substrates via spray deposition with a commercially available airbrush, though other deposition methods work as well. The spray deposition involves the aforementioned two-part mixture containing ITO powder (9:1 In:Sn ratio, ~20 µm diameter particles) and ITO sol-gel precursors (9:1 In:Sn) in an acidified ethanolic solvent. The ratio of powder to sol-gel as well as the total amount of precursor mixture deposited onto the substrate readily controls the final RF of the HSE. After allowing films to dry, they are calcined in air for crosslinking and crystallization of the sol, followed by further calcination in $N_2$ to produce oxygen defects for improved electrical conductivity.

Figure 3:
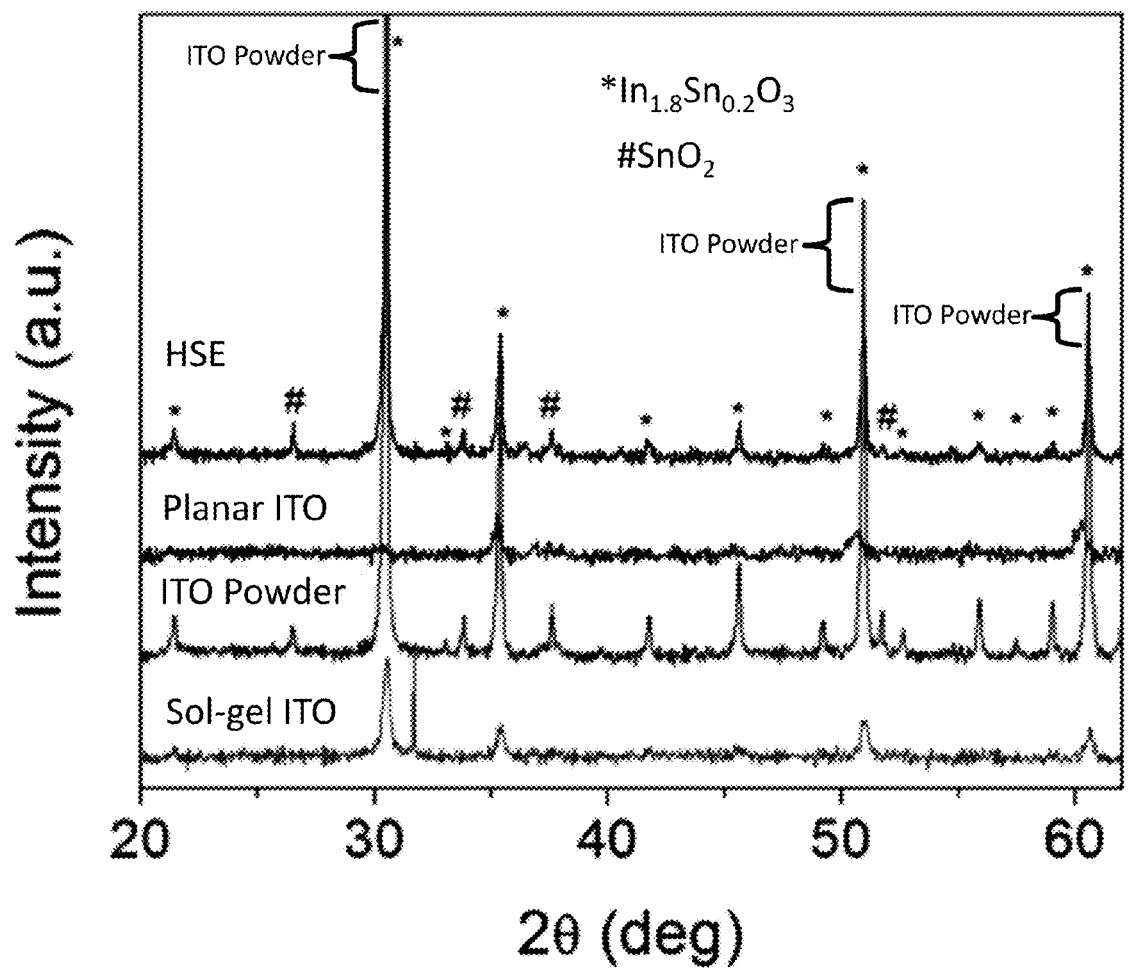
FIG. 3 shows XRD of HSE film and its various components, where the narrow FWHM (Scherrer broadening) of the ITO powder indicates the presence of larger crystallites than in the sol-gel ITO or planar ITO, according to one embodiment of the invention.

As-made ITO HSEs appear both highly porous and highly crystalline as viewed by SEM (FIG. 1b and FIGS. 2a-2c). The ~20 µm spherical ITO powder particles create a porous, open network on the micron scale, while the sol-gel precursors densify into smaller crystallites of ~50 nm and appear as a rough texture which coats and binds the large particles together. Scherrer broadening observed in X-ray diffraction (XRD) of a pure sol-gel derived ITO film deposited onto soda lime glass (FIG. 3) confirms the nanocrystalline nature of the ITO in this component of the system. The as-fabricated HSE shows reflections from both the bixbyite structure of ITO and cassiterite structure of $SnO_2$. The $SnO_2$ phase impurity also exists in the commercial ITO powder but is not present in the dense planar substrate or sol-gel film (FIG. 3) suggesting that the commercial powder is the source of the impurity present in the as-fabricated HSE film.

Figure 4:
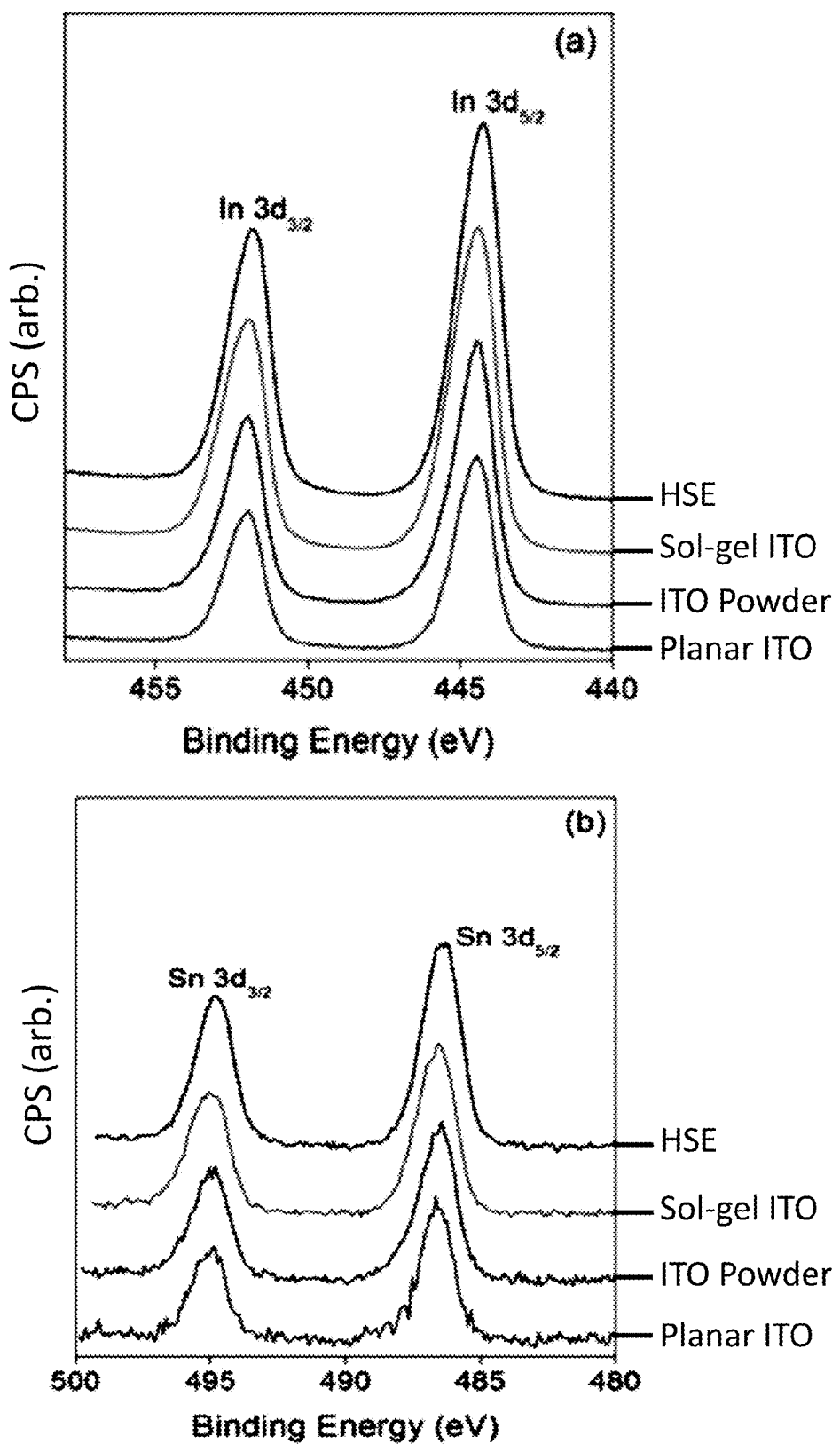
FIGS. 4a-4c show a) and b) XPS of HSE and its various components, c) The surface In:Sn ratio remains consistent between components, according to one embodiment of the invention.
Figure 4:
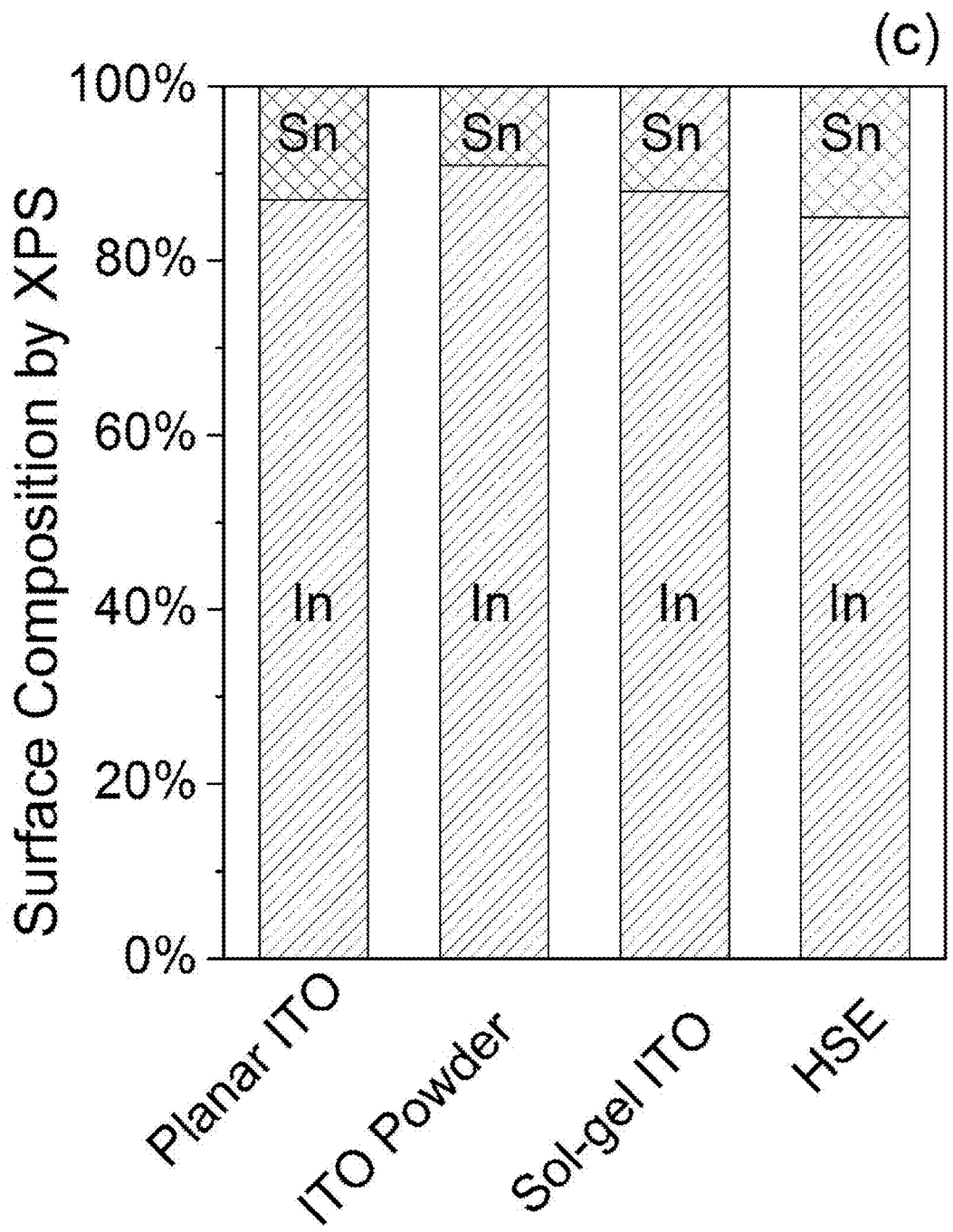

X-ray photoelectron spectroscopy (XPS) studies revealed minimal variation in the In and Sn core electron binding energies (FIG. 4a and FIG. 4b) between the HSE and its individual ITO components (planar, particulate, and sol-gel), confirming consistent surface oxidation states for the In and Sn across the components. The surface composition also remains consistent, as obtained from integration of the In and Sn peak areas (FIG. 4c).

Figure 5:
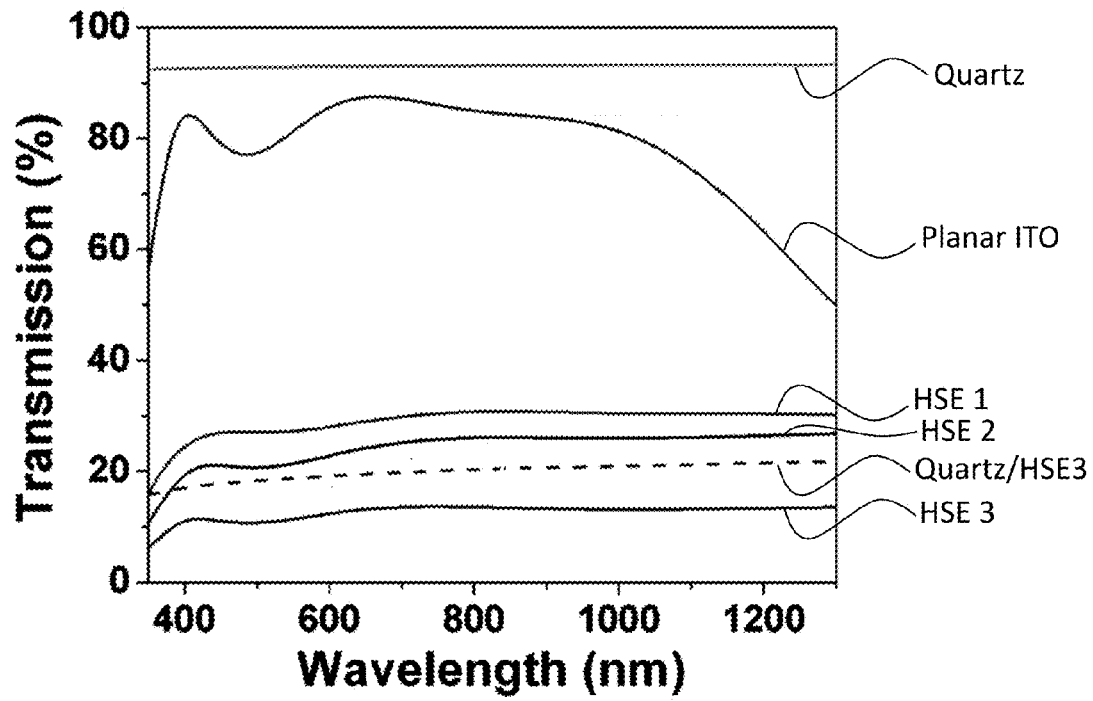
FIG. 5 shows Transmission UV-Vis-NIR spectra of HSE devices and select control samples, according to one embodiment of the invention.

Optical properties of the HSEs were studied by UV-Vis transmission measurements of three HSEs of increasing RF (labeled HSE 1-3, respectively) and are shown in FIG. 5. This figure also shows several reference samples that help elucidate the optical properties of the ITO particle/sol-gel layer. These include a planar ITO/glass substrate with no particle/sol-gel coating, a blank uncoated quartz substrate (with no ITO of any kind), and a particle/sol-gel layer on quartz (labeled Q3) identical to the particle/sol-gel layer used to make HSE 3. The measurement setups are detailed in the experimental section. It is important to note that these HSE films scatter light very strongly and that a measured loss of transmission is not simply due to light absorption by the ITO, i.e., $T \neq 1-A$, where A is absorptance. Rather, transmission is defined as:

$$T = 1 - A - R_{sp} - R_d - L_s$$

where $R_{sp}$, is specular reflectance, $R_d$ is diffuse reflectance, and $L_s$ is a summation of any additional light lost due to scattering which is not traditionally characterized by the other, discrete variables in the equation. This last term, $L_s$, is a consequence of both sample and experimental instrument geometry and, in our case, is predominantly composed of light scattered into and then along the plane of the glass substrate via internal reflection. The result is that some portion of light is lost through the edges of the substrate, an effect which can contribute up to tens of percent to the loss in transmission for highly scattering samples.

Figure 6:
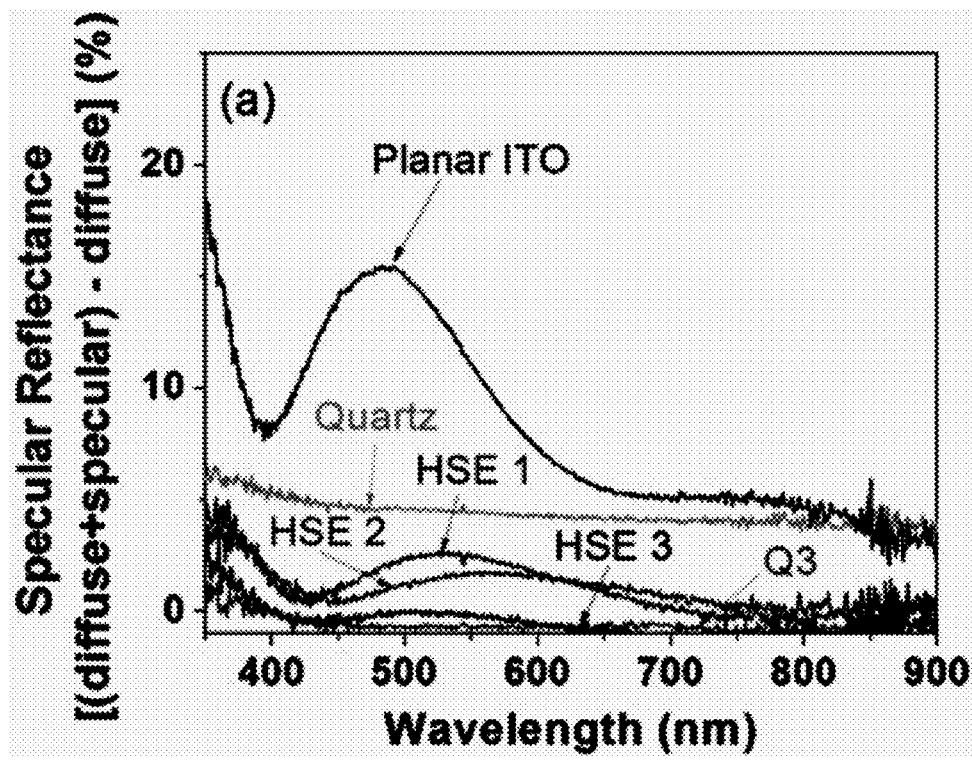
FIGS. 6a-6c show UV-Vis-NIR of films, plotted in its various components of (a) specular reflectance, (b) diffuse reflectance, and (c) absorption, where (a) and (b) were measured with samples placed on the outer port of an integrating sphere, (c) was measured with samples inside an integrating sphere, according to one embodiment of the invention.
Figure 6:
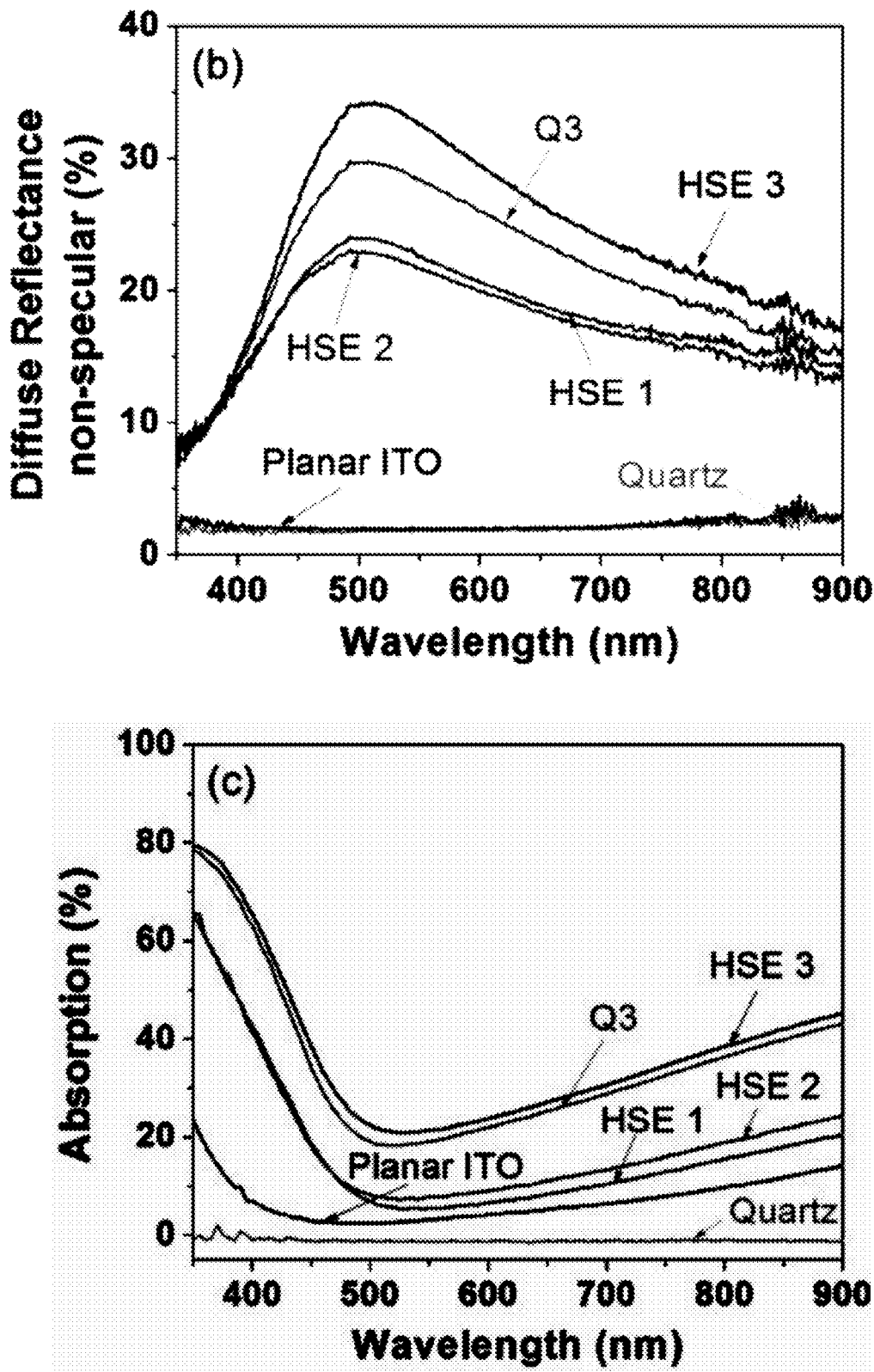

As expected for the blank quartz, no discrete absorption features are observed (FIG. 5) but the overall transmission is slightly attenuated by $R_{sp}$ off the substrate surfaces (FIG. 6a). The planar ITO substrate exhibits a known absorption onset at wavelengths shorter than ~400 nm, Fabry-Perot interference from 400-650 nm with a corresponding Rv peak (FIG. 6a) and an additional, broad loss of transmission which increases in magnitude from ~700 nm towards the IR that is dependent on free carrier concentration (FIG. 5). The HSE films on both quartz (sample Q3) and planar ITO substrates (samples HSE 1-3) exhibit features similar to the uncoated planar ITO films, but with much lower overall transmission. This predominantly wavelength independent attenuation of transmission across the visible can be explained by three factors: (1) more ITO material is present (films are thicker) in the HSEs and thus the total absorption increases (see FIG. 6c) compared to flat films, (2) the HSE films induce more light scattering events which drive light off-axis from the transmission UV-Vis detector, and (3) this same efficient light scattering within the HSE structure further results in more absorption events for the HSE as compared to the planar film.

The second factor mentioned (transmission losses due to scattering) is important to note as it is a result of experimental geometry and does not indicate absorption by the ITO. By controlling the amount of material deposited and particle size used during synthesis, these HSEs can be tailored to match the desired optical properties to balance the enhancement from scattering versus the losses from absorption, reflection, and transmission for a given application.

Figure 7:
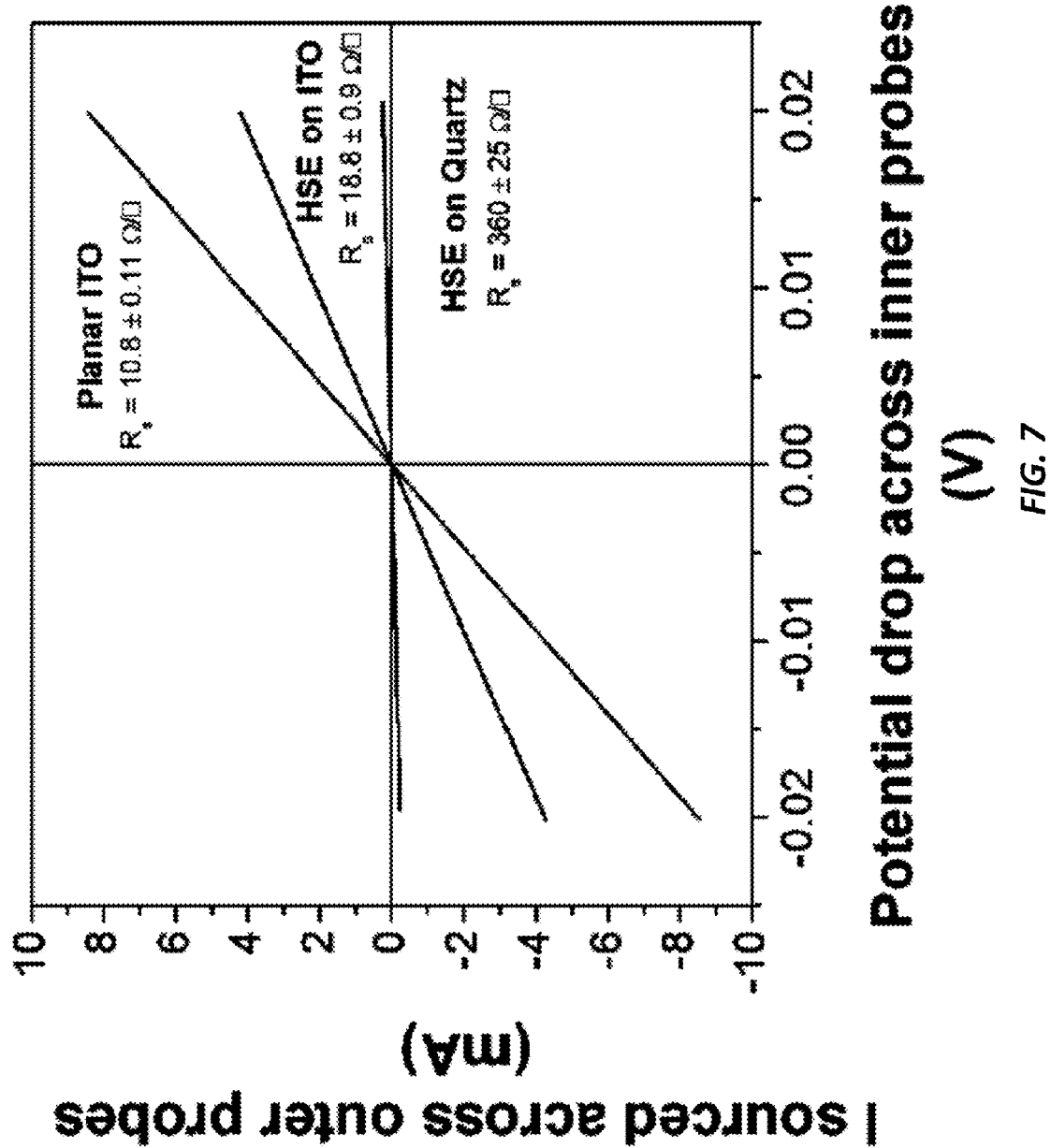
FIG. 7 shows 4-point probe measurements of bare planar ITO films, HSE (particles/sol-gel) on planar ITO substrates, HSE (particles/sol-gel) films on insulating quartz substrates, according to one embodiment of the invention.

To investigate the electrical sheet resistance ($R_s$) of fully assembled HSEs as well as that of the HSE spray-coated directly onto a quartz substrate (with no planar ITO underlayer), four-point probe measurements were employed. Example current-voltage plots are presented in FIG. 7 for bare planar ITO, HSE devices and particle/sol-gel films on quartz. In general, $R_s$ values for HSEs fabricated on insulating quartz substrates range from 0.2-2.0 k$\Omega$ sq$^{-1}$, illustrating that an excellent conductive percolation network exists along the plane of the film even without an underlying conductive substrate. The sheet resistance measured on fully assembled HSEs (planar ITO substrate with particle/sol-gel layer on top) is 18.8±0.9 $\Omega$ sq$^{-1}$ for samples with a RF equivalent to sample HSE 2 and varies by no more than ±2 $\Omega$ sq$^{-1}$ for the other HSEs. This sheet resistance is within a factor of 2 of an unmodified planar ITO substrate, (10.8±0.11 $\Omega$ sq$^{-1}$), and thus the HSE maintains excellent conductive properties as a device.

Figure 8:
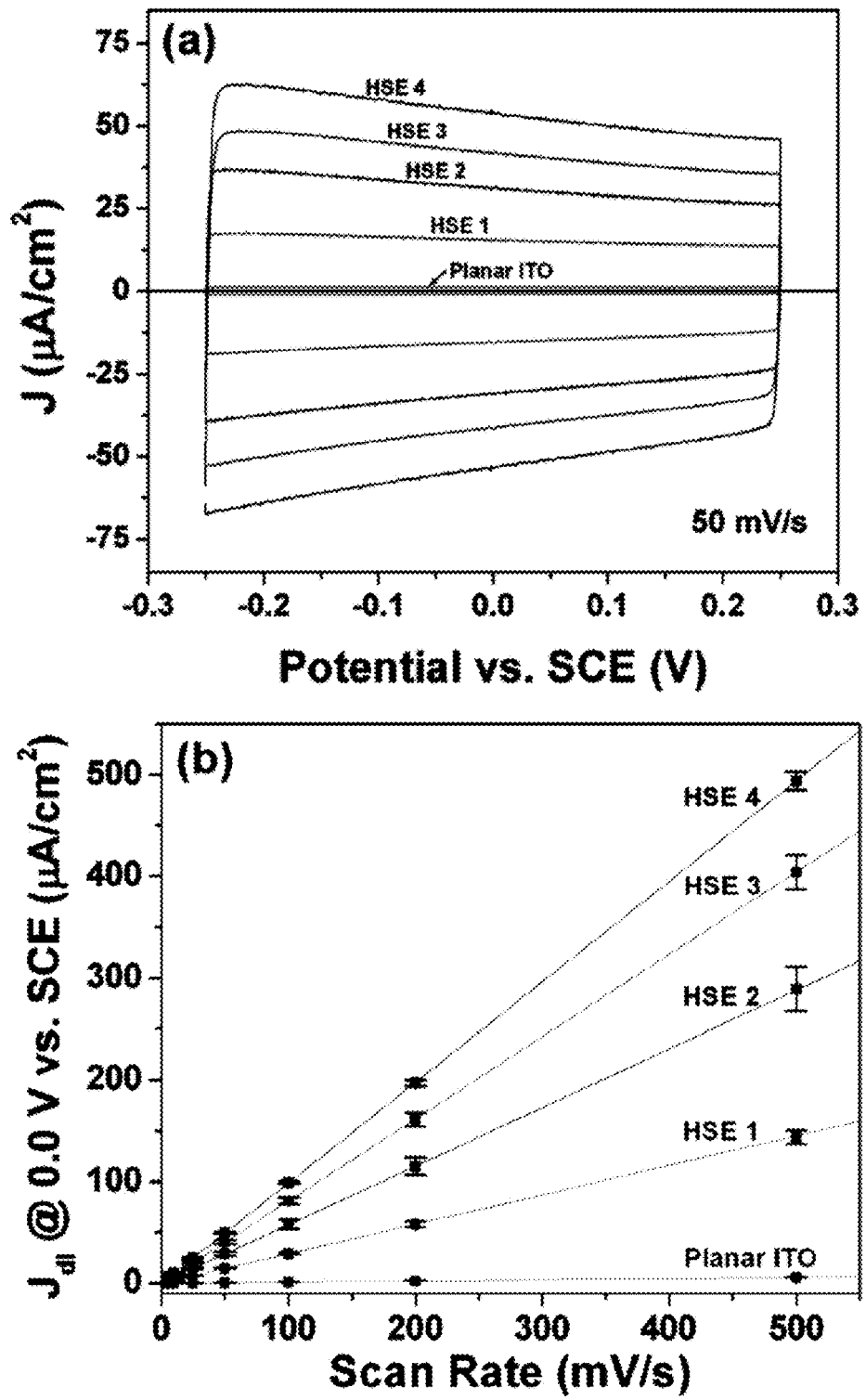
FIGS. 8a-8d show a) cyclic voltammograms comparing the capacitance charging of four HSE films of increasing RF and planar ITO at 50 mV s$^{-1}$, b) the capacitance charging current, $J_{dl}$, (extracted from the CVs as the oxidative current at 0.0 V vs. SCE) as a function of scan rate is linear for all HSEs and planar ITO, where solid lines indicate linear regressions fit to zero; the roughness factors measured by capacitance charging extracted from c) CV scans and d) impedance spectroscopy illustrate how desired surface areas can be targeted synthetically, according to one embodiment of the invention.
Figure 8:
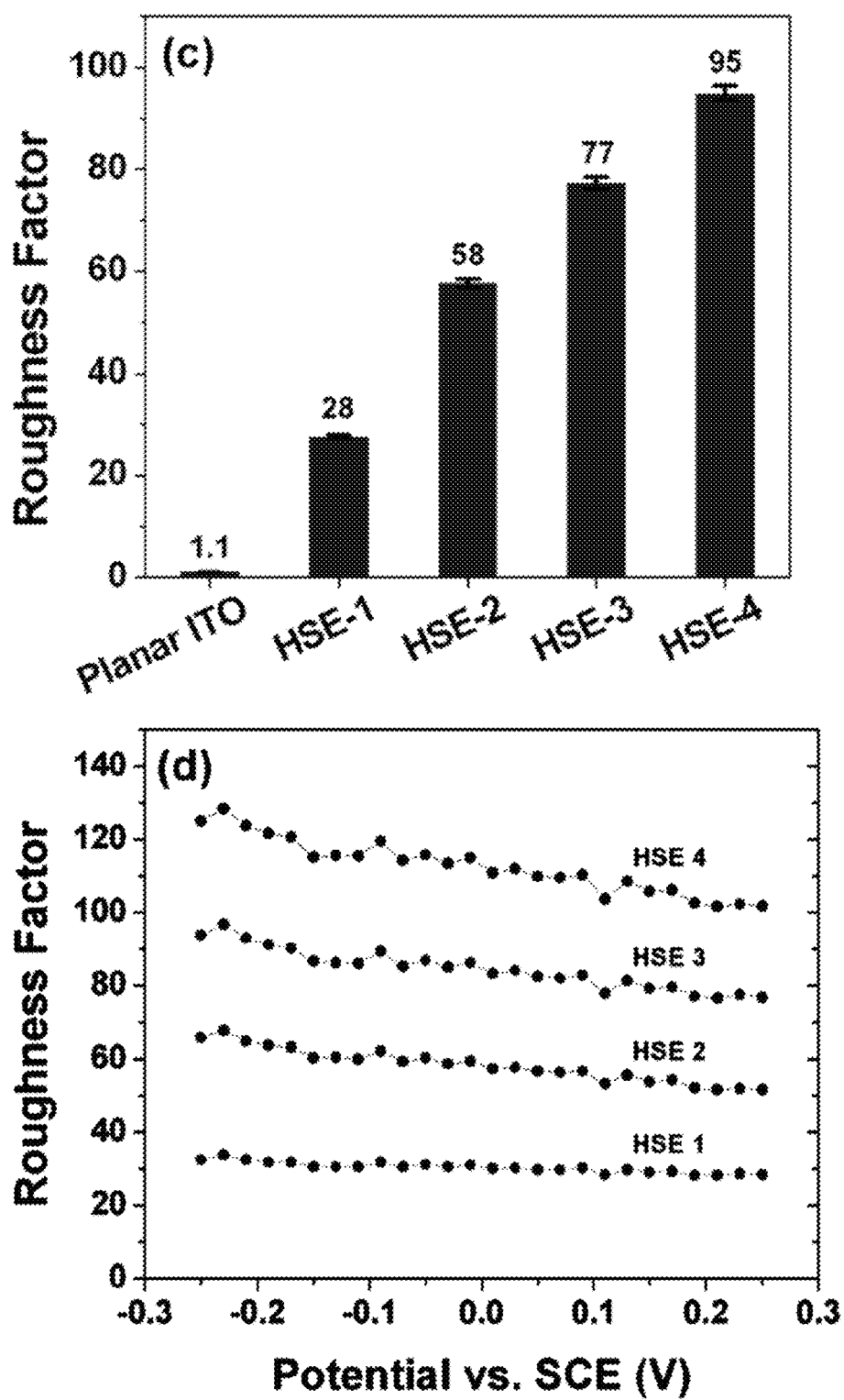
Figure 9:
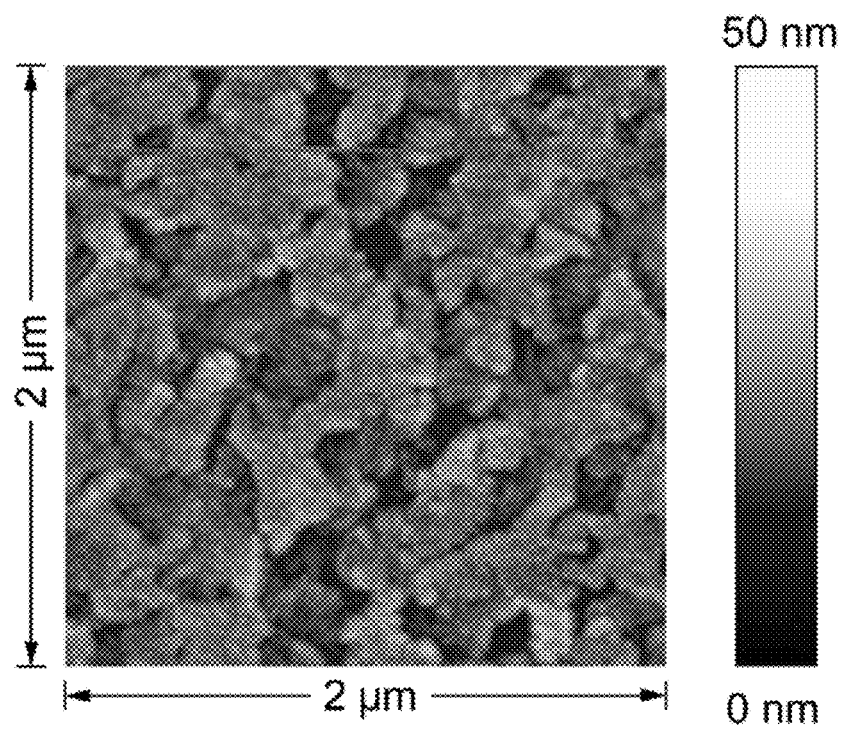
FIG. 9 shows atomic force microscopy of a planar ITO surface which possesses an intrinsically textured RF of 1.1.
Figure 10:
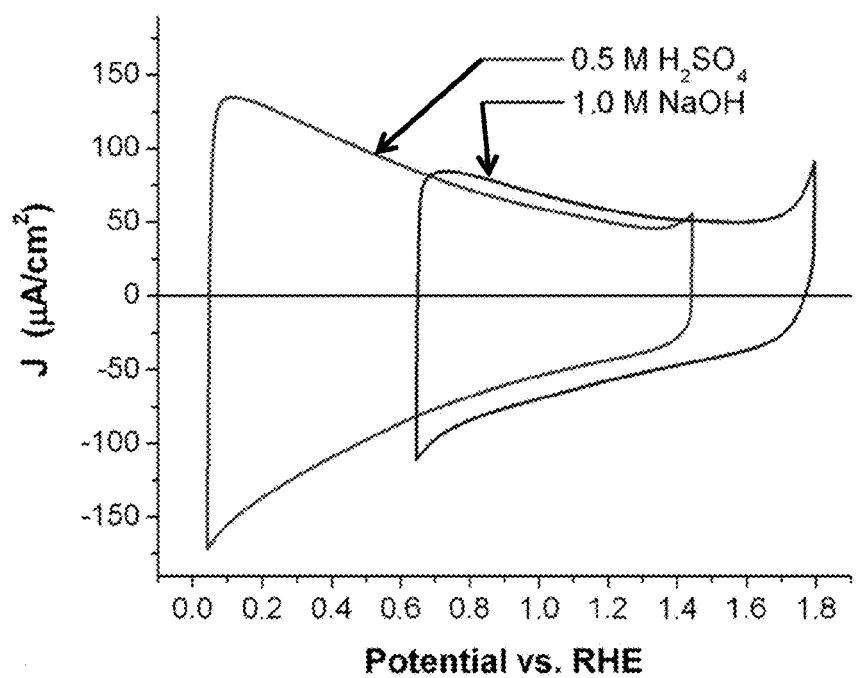
FIG. 10 shows cyclic voltammograms of HSE taken in 0.5 M H$_2$SO$_4$ and 1.0 M NaOH, referenced to the reversible hydrogen electrode, according to one embodiment of the invention.

The hierarchical pore size distribution of the ITO HSE bodes well for facile diffusion of reactants and products to and from the electrode surface. The electrochemically active surface area was quantified by comparing the ratio of electrochemical double-layer capacitance-charging current density, $J_{dl}$, in cyclic voltammograms (CV) of planar ITO and HSEs collected at scan rates from 5-500 mV s$^{-1}$. FIG. 8a shows CVs at 50 mV s$^{-1}$ comparing planar ITO and HSE 1-4, where higher numbers indicate controllably higher surface area. There are no distinct Faradaic redox features and the symmetrical $J_{dl}$ for charge/discharge decreases in the anodic direction, likely because this is approaching the potential of zero charge (PZC). Qualitatively, this is consistent with ITO's isoelectric point of ~8; in the pH 13.6 NaOH electrolyte the ITO surface should be highly negatively charged and anodic polarization will reduce this charge and the associated $J_{dl}$. However, these polycrystalline systems can be complicated by crystal-face dependent surface reconstructions which may vary slightly between the planar ITO and HSE surfaces. The $J_{dl}$, which is proportional to surface area and measured for all samples as the oxidative current at 0.0 V vs. SCE on the CVs, is plotted as a function of scan rate in FIG. 8b. Since $J_{dl}$ is classically described as a process with no diffusion component, the expected linear relationship between $J_{dl}$ and scan rate is observed (FIG. 8b). The ratio of HSE to planar ITO capacitance at a given scan rate yields the RF of each HSE and is plotted in FIG. 8c. These HSE RF values are an average of all scan rates and have been adjusted to compensate for the actual RF value of the planar ITO, (RF=1.10) which was measured by AFM (FIG. 9). Furthermore, the HSEs exhibit a wide potential stability window in both basic (1.0 M NaOH) and acidic (0.5 M $H_2SO_4$) electrolytes (FIG. 10).

Figure 11:
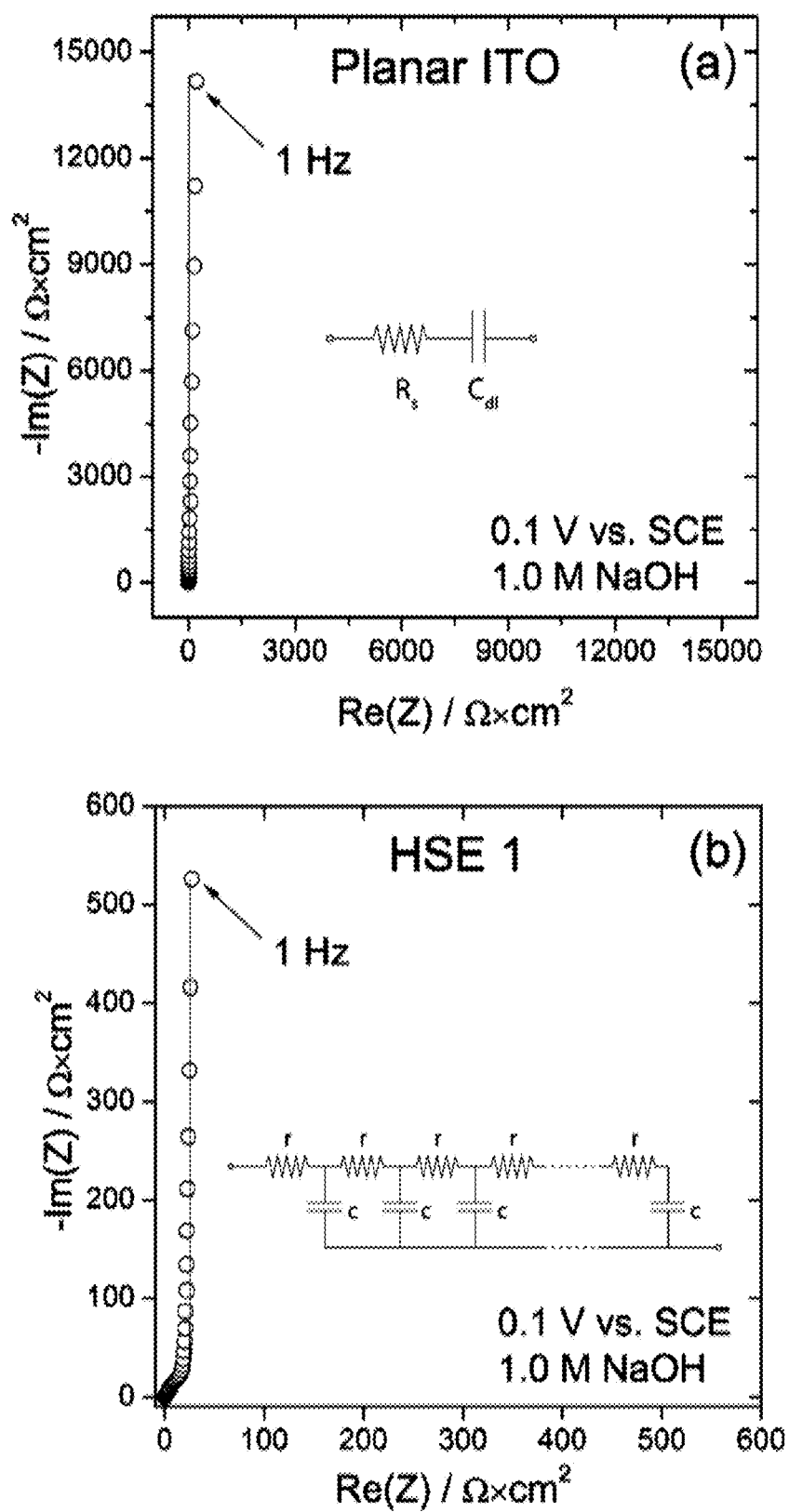
FIGS. 11a-11b show representative Nyquist plots for (a) planar ITO and (b) HSE 1 over a frequency range from 100 kHz to 1 Hz, where measured data is displayed as open circles; the solid black lines represent modeled fits from which the capacitance was extracted to calculate the RF values and the circuits used to model each fit are shown as insets, according to one embodiment of the invention.

The HSE RF values compiled from CVs were corroborated using stepped potential electrochemical impedance spectroscopy (SPEIS). FIG. 11a and FIG. 11b show representative Nyquist plots at 0.0 V vs. SCE for planar ITO and HSE 1. The impedance response of planar ITO could simply be fit to a series RC circuit at all frequencies. In contrast, the impedance response of HSE electrodes was split into two distinct domains. In the low frequency domain, the response could be represented by a series RC circuit. However, the high frequency domain produces a sloped line characteristic of a Warburg impedance that arises from diffusion limitations in a semi-infinite medium. To accurately model this response, the data was fit to a transmission line model. From this model, the resulting capacitance at each potential was normalized to the capacitance obtained for planar ITO to determine the RF of each HSE sample (FIG. 8d). Very good agreement is found between the SPEIS and CV derived RF values at all potentials, validating the measured RF of approximately 100 for the highest surface area HSE within this set of samples.

High surface area ITO electrodes with high conductivity are provided, with controllable roughness factors and tunable optical properties using a synthetic route applicable to large-scale fabrication without the need for templating agents. Physical and electrical characterization of these electrodes indicates they are transparent, porous, crystalline, and conductive with sheet resistances of 19 $\Omega$ sq$^{-1}$. These films can be fabricated with RFs ranging from 1 to >140, i.e. up to two orders of magnitude more surface area than a planar film. When deposited onto a conductive substrate such as planar ITO, these hierarchically porous thin films dramatically increase active surface area while maintaining high conductivity throughout the electrode. The high surface area, transparency and conductivity are commensurate with requirements for many optoelectronic applications that require enhanced materials performance without enduring resistive losses or sacrificing mechanical or chemical stability. The synthetic methodology of the current invention is amenable to other oxide and TCO materials including fluorine doped tin oxide (FTO), aluminum zinc oxide (AZO), aluminum tin oxide (ATO) and many other well utilized materials in optical and/or electronic fields. This development of high surface area transparent conducting oxide electrode enables numerous opportunities to develop a wide range of high performance, low-cost optoelectronic devices.

An exemplary method of one embodiment of the current invention is provided, where commercial indium tin oxide (ITO) films were purchased on low alkaline earth boro-aluminosilicate glass (4-10 $\Omega$ sq$^{-1}$, cut edges). Films were pre-cleaned by sonication in acetone, then isopropanol for one hour each. ITO powder (9:1, In:Sn, ≥99.99% metals basis, −325 mesh) was used as received. ITO sol-gel was prepared from anhydrous SnCl$_4$, Indium (III) acetylacetonate (99.99% metals basis), ethanol (200 proof), and HCl (concentrated). All chemicals were used as received. For sol-gel preparation, a 12.6 mg ml$^{-1}$ ethanolic solution of tin (IV) chloride was prepared under argon purging. One ml of this solution was added to 200 mg In (III) acetylacetonate to which 0.05 ml of conc. HCl was added, followed by an additional 0.85 ml of ethanol and stirred for a minimum of 30 minutes before use.

A mixture of ITO powder and sol-gel solution with a typical ratio of 200 mg powder to 2 ml sol-gel was spray deposited via a standard commercial airbrush onto the appropriate substrate. After deposition, films were calcined in a 3-step procedure. Step 1 is heating to 300° C. at 0.3° C. min$^{-1}$ in air, step 2 is heating to 450° C. at 10° C. min$^{-1}$ in air, and step 3 is heating to 450° C. at 10° C. min$^{-1}$ in N$_2$.

Sheet resistance was measured using a four-point probe connected to a potentiostat. Tip spacing of 1.0 mm, 45 g spring pressure and a large probe-tip radius of 0.5 mm proved effective in reproducibly measuring the highly textured films.

All electrochemistry was performed using a potentiostat with EC-Lab software. Samples were prepared by contacting a Cu wire to the ITO substrate with conductive paint and encasing in insulating epoxy. Electrodes were photographed and geometric surface area was measured using Image-J software. This epoxy encased electrode was fully submerged in electrolyte for testing. Platinum mesh and saturated calomel (SCE) served as the counter and reference electrodes, respectively.

Electrochemical capacitance was measured by cyclic voltammetry in aqueous 1.0 M NaOH (99.99% metals basis). For each scan rate, three CV cycles were swept from −0.25 to 0.25 V vs. SCE and data from the 3rd sweep was utilized. No change was observed between the 2nd and 3rd sweep.

Stepped potential electrochemical impedance spectroscopy (SPEIS) was performed from −0.25 to 0.25 V vs. SCE at 20 mV potential steps with a 5 second rest period between each step. A 20 mV amplitude AC signal was superimposed on each DC potential and data was collected at 10 logarithmically spaced frequencies per decade from 1 Hz to 100 kHz.

X-ray diffraction was performed using Cu K$_\alpha$ radiation on a diffractometer in parallel beam mode with a programmable divergence slit and PIXcel detector. Scanning electron microscopy was performed with an acceleration voltage of 5 kV. X-ray photoelectron spectroscopy was performed with binding energies referenced to adventitious carbon at 284.6 eV. Transmission UV-Vis spectroscopy was performed. Diffuse and specular reflectance UV-Vis spectroscopy were performed using an integrating sphere coupled to a Xenon arc lamp for source illumination and a spectroradiometer for measurement.

In another example of one embodiment, indium tin oxide (ITO) HSEs were fabricated by doctor blading or spray coating.

A mixture of ITO powder and sol-gel solution with typical ratios of 200 mg powder to 2 mL sol-gel was prepared and then spray deposited via a standard commercial airbrush onto the commercial substrates described above. The ratio of powder to sol-gel can be varied significantly and still result in conductive, mechanically stable, and high surface area TCO films.

For films made via the doctor blade technique, a thickness spacer of commercially available scotch tape was applied to the edges of a TCO substrate. A slurry that includes ITO powder combined with the minimum volume of liquid sol-gel required to produce a viscous paste was then spread between the scotch tape spacers. A rigid screed was drawn across to remove excess slurry. The tape was then removed and sol-gel allowed to dry, resulting in a film of controllable thickness.

After film deposition, a calcination step is employed to crystallize the adhesion layer. Specifically, for ITO films:
a) Step 1: a slow ramp of 0.3° C./min up to 300° C. in air to induce crosslinking within the gel.
b) Step 2: calcination at 10° C./min up to 450° C. in air to dehydrate and crystallize the gel into an oxide.
c) Step 3: calcination at 10° C./min up to 450° C. in an inert or reducing atmosphere such as N$_2$ to partially oxygen-defect the oxide which increases the conductivity of the films.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example, other useful TCO's include those that contain various binary, ternary or quaternary mixtures of, In, Ga, Zn, Sn, Cu, Sb, Cd, Al, and various atomic ratios. In another example, the substrate can be a non-conducting substrate such as quartz.

All such variations are considered to be within the scope and spirit of the present invention as defined by the following claims and their legal equivalents.

What is claimed:

1. A method of forming a light scattering and intrapore mass transport structured transparent conducting electrode, comprising:
   a. depositing a single porous non-planar inorganic light scattering and intrapore mass transport structured transparent conducting thin film on a conductive substrate, wherein said intrapore mass transport structure is continuous throughout said transparent conducting thin film, wherein said single porous non-planar inorganic light scattering and intrapore mass transport structured transparent conducting thin film comprises transparent conductive inorganic particles coated with an inorganic sol-gel solution-based transparent conducting adhesive layer without an organic templating agent, wherein said inorganic sol-gel solution-based transparent conducting adhesive layer coats and binds together said inorganic transparent conducting particles, wherein a porosity of said porous non-planar inorganic transparent conducting thin film is formed that comprises an interconnected network of pores comprising periodic arrays of pores or disordered pores throughout said structure, wherein said pores comprise mesoscale pores or macroscale pores, wherein said mesoscale pores comprise pore sizes between 2-50 nm diameters, wherein said macroscale pores comprises pore sizes greater than 50 nm diameters that enable light scattering and intrapore mass transport; and
   b. heat treating said porous non-planar light scattering and intrapore mass transport structured inorganic transparent conducting adhesion layer on said inorganic conductive substrate, wherein an open porous non-planar inorganic transparent conducting electrode is formed that enables said light scattering and intrapore mass transport.

2. The method according to claim 1, wherein said light scattering and intrapore mass transport structured transparent conducting thin film has a thickness in a range of a monolayer of said particles to 10$^4$ layers of said particles.

3. The method according to claim 1, wherein said light scattering and intrapore mass transport structured transparent conducting particles have a size in a range of 1 nm to 1 mm.

4. The method according to claim 1, wherein said light scattering and intrapore mass transport structured transparent conducting electrode has a resistance in a range of 1-30 Ω sq$^{-1}$.

5. The method according to claim 1, wherein said light scattering and intrapore mass transport structured transparent conducting electrode has roughness factor in a range of 1-140.

6. The method according to claim 1, wherein said heat treating of said light scattering and intrapore mass transport structured transparent conducting electrode is comprises using a calcining process in i) air, ii) inert gas, or i) and ii).

7. The method according to claim 1, wherein said substrate is selected from the group consisting of metal, carbon, conductive oxide and non-conductive material, wherein said non-conductive material comprises quartz.

8. The method according to claim 1, wherein said light scattering and intrapore mass transport structured transparent conductive thin film is selected from the group consisting of indium tin oxide (ITO), fluorine doped tin oxide (FTO), Gallium zinc oxide, aluminum zinc oxide (AZO), and antimony tin oxide (ATO).

9. The method according to claim 1, wherein said light scattering and intrapore mass transport structured transparent conducting particles are selected from the group consisting of indium tin oxide (ITO), fluorine doped tin oxide (FTO), Gallium zinc oxide, aluminum zinc oxide (AZO), and antimony tin oxide (ATO).

10. The method according to claim 1, wherein said sol-gel solution-based transparent conducting adhesive layer comprises precursors selected from the group consisting of indium tin oxide (ITO), fluorine doped tin oxide (FTO), Gallium zinc oxide, aluminum zinc oxide (AZO), and antimony tin oxide (ATO).

* * * * *